US008861207B2

(12) United States Patent
Chu

(10) Patent No.: US 8,861,207 B2
(45) Date of Patent: Oct. 14, 2014

(54) FLEXIBLE PRINTED CIRCUIT MODULE AND PORTABLE ELECTRONIC DEVICE USING SAME

(75) Inventor: Hung-Yun Chu, New Taipei (TW)

(73) Assignee: Chi Mei Communication Systems, Inc., New Taipei (TW)

( * ) Notice: Subject to any disclaimer, the term of this patent is extended or adjusted under 35 U.S.C. 154(b) by 324 days.

(21) Appl. No.: 13/283,261

(22) Filed: Oct. 27, 2011

(65) Prior Publication Data
US 2012/0243187 A1 Sep. 27, 2012

(30) Foreign Application Priority Data
Mar. 22, 2011 (TW) .................................. 100109659

(51) Int. Cl.
*H05K 5/00* (2006.01)
(52) U.S. Cl.
USPC ........................................................ 361/752

(58) Field of Classification Search
USPC ........................................................ 361/752
See application file for complete search history.

(56) References Cited

U.S. PATENT DOCUMENTS

| 7,813,145 B2 * | 10/2010 | Stoneham et al. ............. 361/818 |
| 8,531,844 B2 * | 9/2013 | Nishiwaki ...................... 361/752 |
| 2003/0193787 A1 * | 10/2003 | Manabe et al. ................. 361/752 |
| 2005/0259406 A1 * | 11/2005 | Gramse et al. ................. 361/752 |
| 2008/0062661 A1 * | 3/2008 | Choi et al. ....................... 361/752 |
| 2011/0002106 A1 * | 1/2011 | Bentley et al. ................. 361/752 |
| 2011/0226599 A1 * | 9/2011 | Xiao ............................... 200/341 |

* cited by examiner

*Primary Examiner* — Forrest M Phillips
(74) *Attorney, Agent, or Firm* — Novak Druce Connolly Bove + Quigg LLP

(57) ABSTRACT

A FPC module includes a FPC board and a supporting member. The FPC board is fixed on a cover of an electronic device, one end of the FPC board has at least one electrical terminals fixed thereon. The supporting member fixed on the end of the FPC board, and the supporting member is latched on the cover.

14 Claims, 8 Drawing Sheets

FLEXIBLE PRINTED CIRCUIT MODULE AND PORTABLE ELECTRONIC DEVICE USING SAME

BACKGROUND

1. Technical Field

The disclosure generally relates to flexible printed circuit modules, and particularly to flexible printed circuit modules used in portable electronic device.

2. Description of the Related Art

Portable electronic devices such as mobile phones typically have several flexible printed circuit boards for electronically connecting electronic components of the mobile phone. Conventionally, the flexible printed circuit boards are adhered to cases of the electronic components by double-faced adhesive tapes, and retained in a housing of the mobile phone. However, when a detachable cover, e.g. a battery cover, is detached from the housing of the mobile phone, the flexible printed circuit boards may be peeled off the case and the tape by external forces of the users.

Therefore, there is room for improvement within the art.

BRIEF DESCRIPTION OF THE DRAWINGS

Many aspects of the exemplary flexible printed circuit module and portable electronic device using the flexible printed circuit module can be better understood with reference to the following drawings. The components in the various drawings are not necessarily drawn to scale, the emphasis instead being placed upon clearly illustrating the principles of the exemplary flexible printed circuit module and portable electronic device using. Moreover, in the drawings, like reference numerals designate corresponding parts throughout the diagrams.

DETAILED DESCRIPTION

Figure 1:
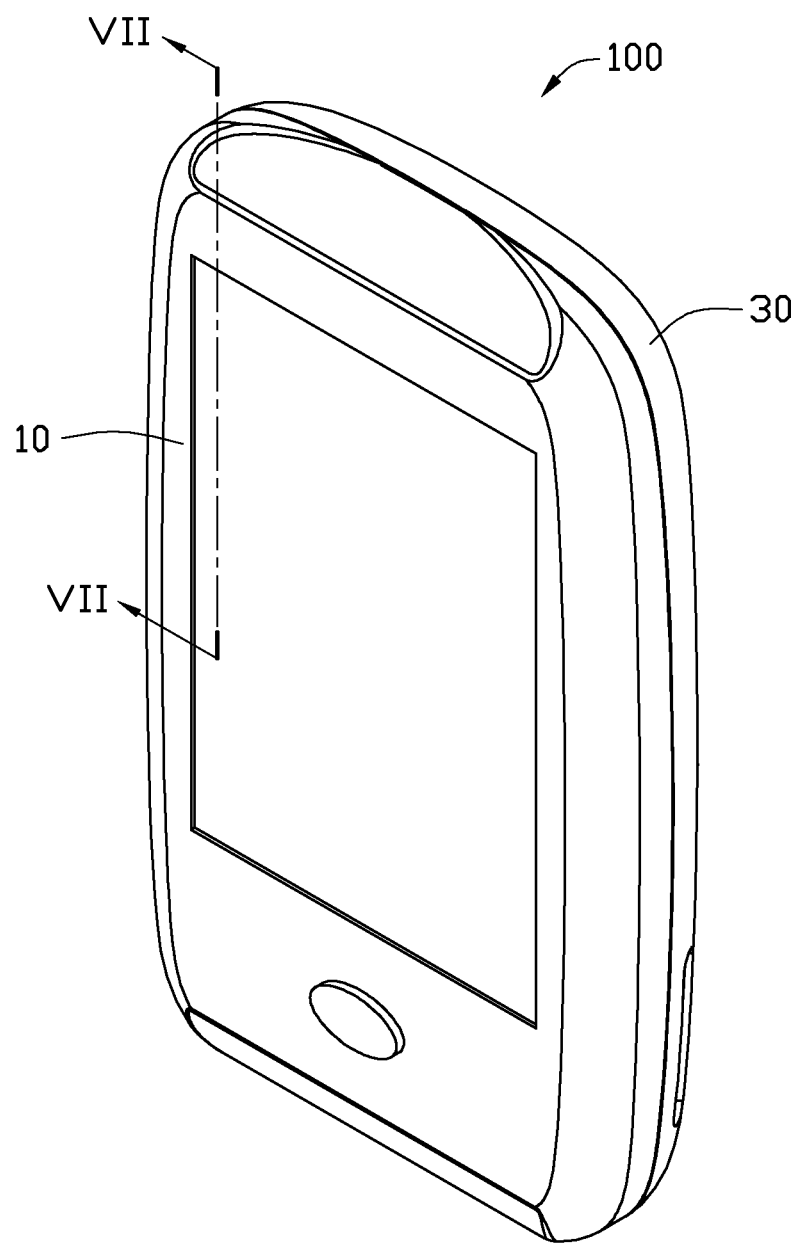
FIG. 1 is an isometric view of a portable electronic device with a flexible printed circuit module according to an exemplary embodiment.
Figure 2:
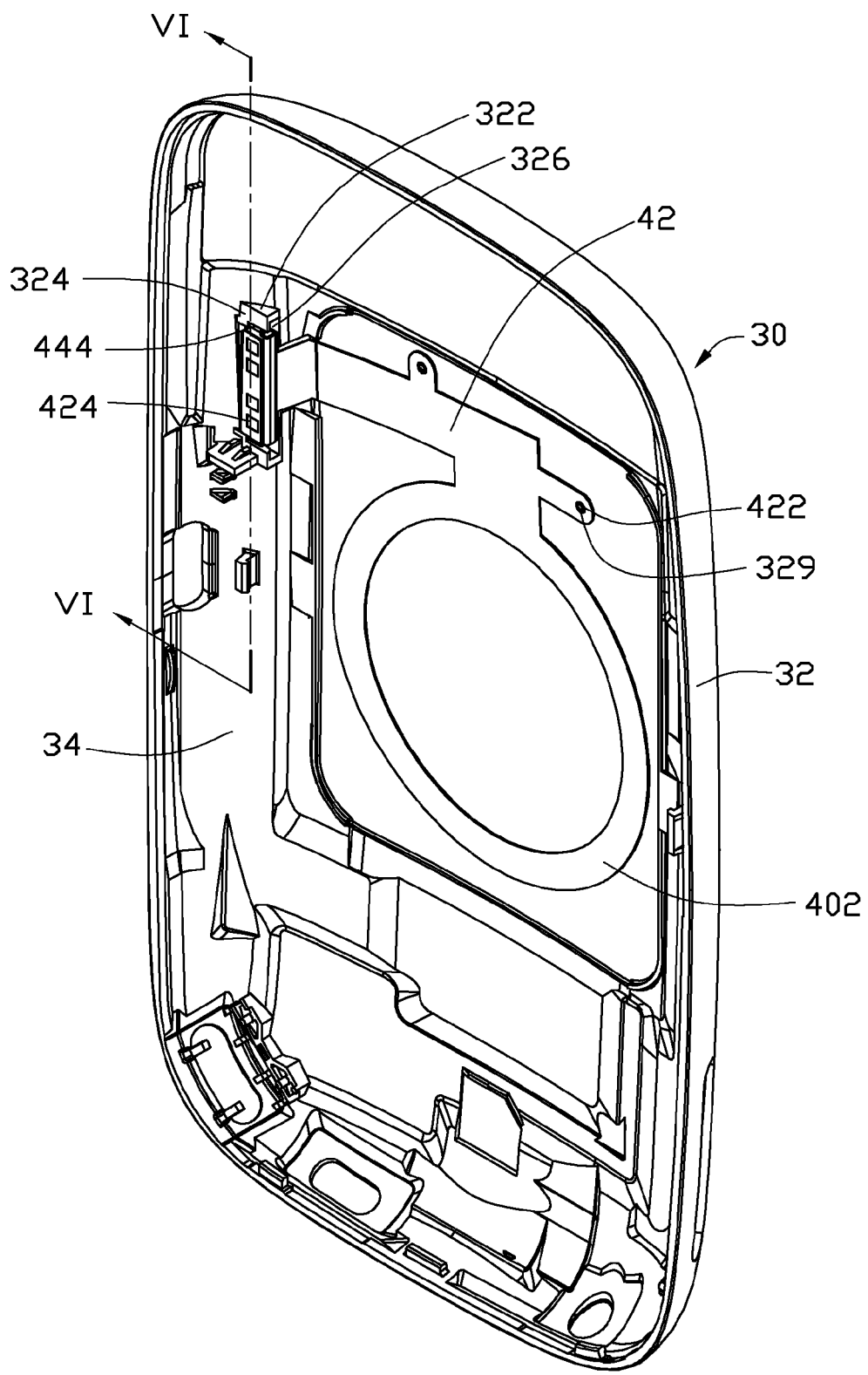
FIG. 2 is an isometric view of a cover of the portable electronic device equipped with the flexible printed circuit module.
Figure 7:
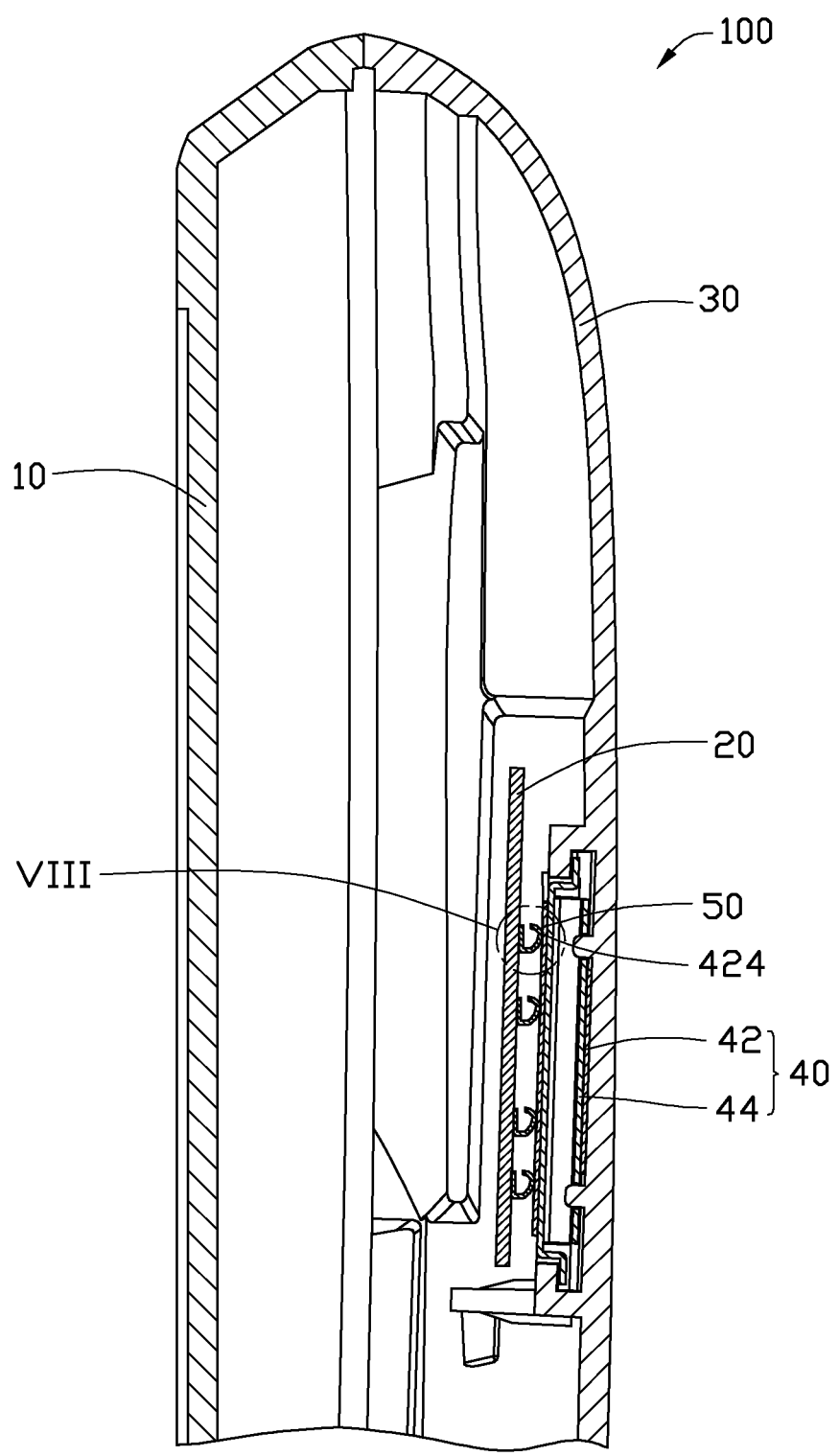
FIG. 7 is a cross-sectional view of the portable electronic device shown in FIG. 1, taken along the line VII-VII.

Referring to FIGS. 1, 2 and 7, an exemplary portable electronic device 100, such as a mobile phone, includes a housing 10, a main board 20, a cover 30, a flexible printed circuit (FPC) module 40 having an induction coil portion 402, and at least one elastic member 50 for electrical connections. The main board 20 is received in the housing 10. The cover 30 is mounted on the housing 10. The FPC module 40 is attached on the cover 30. The at least one elastic member 50 is fixed to the main board 20 for electrically connecting the main board 20 to the FPC module 40.

Figure 3:
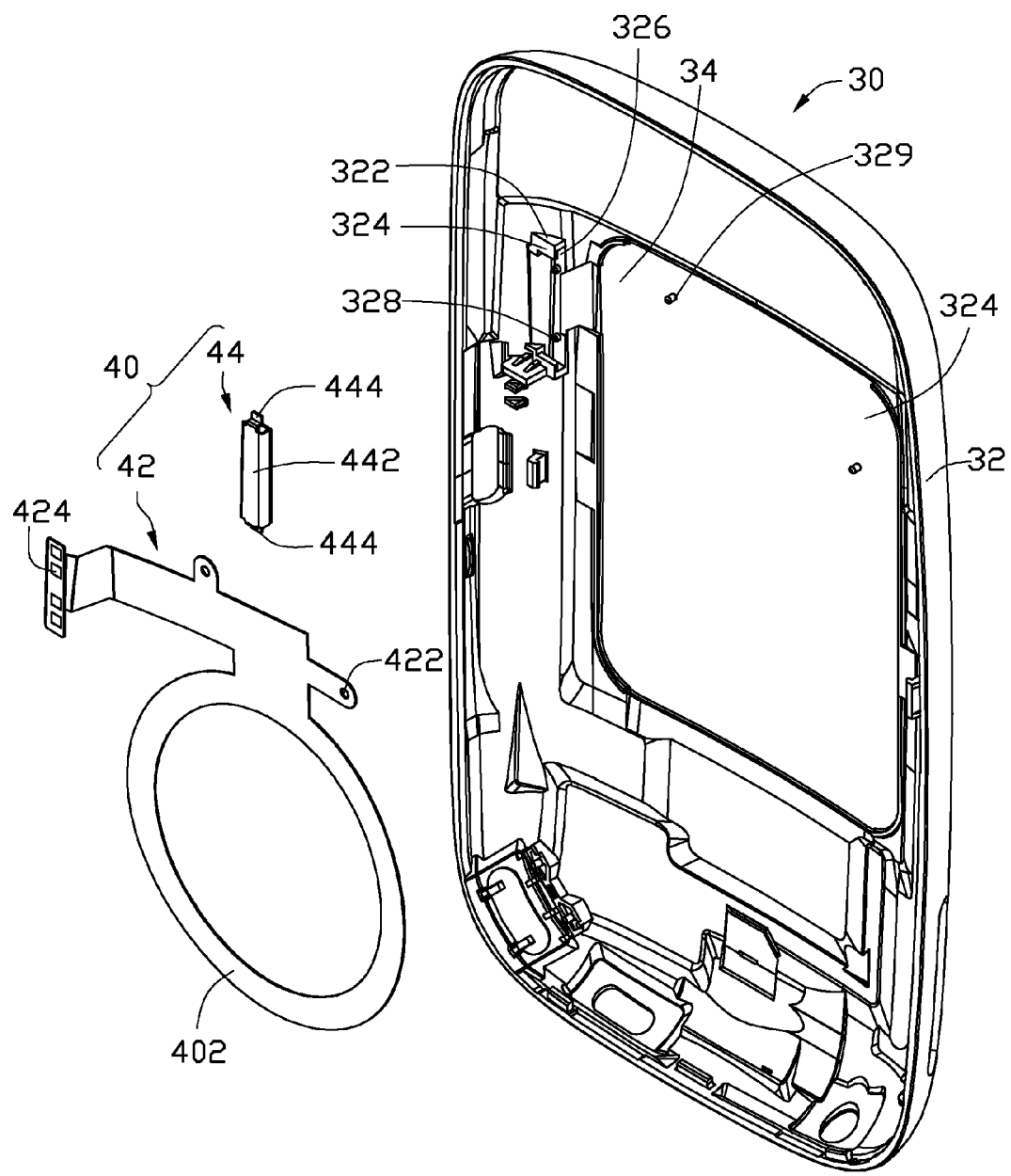
FIG. 3 is an exploded view of the cover and the flexible printed circuit module shown in FIG. 2.

Referring to FIG. 3, the cover 30 includes a sidewall 32 and a bottom wall 34 connecting to the sidewall 32. The sidewall 32 has two opposite latching bases 322 protruding therefrom, and two resisting arms 324, each extending from a distal end of a corresponding latching base 322 and facing towards each other. The latching bases 322, the resisting arms 324 and the bottom wall 34 cooperatively define a latching slot 326 therebetween. The latching slot 326 receives two fixing pins 328 projecting from the bottom wall 34. The bottom wall 34 has two positioning pins 329 protruding therefrom for positioning the FPC module 40.

Figure 4:
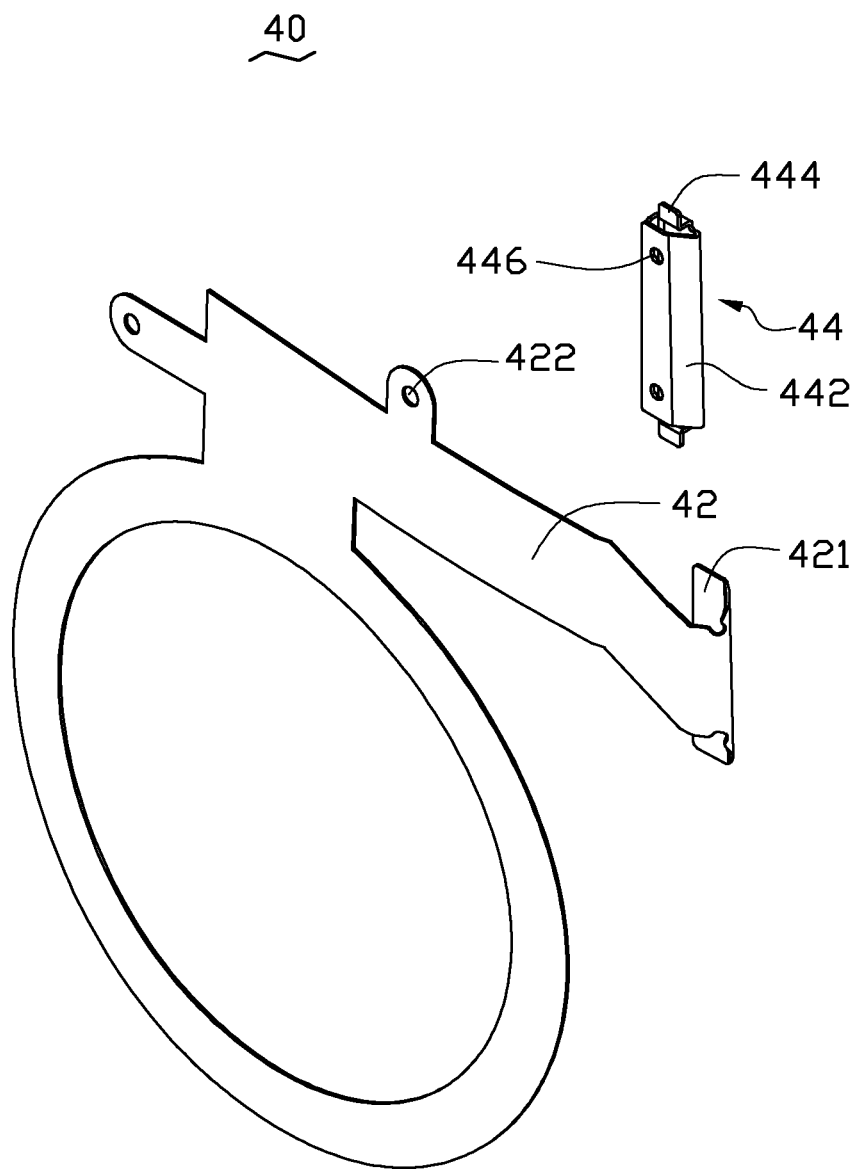
FIG. 4 is enlarged, exploded view of the flexible printed circuit module shown in FIG. 3, but taken from another aspect.
Figure 5:
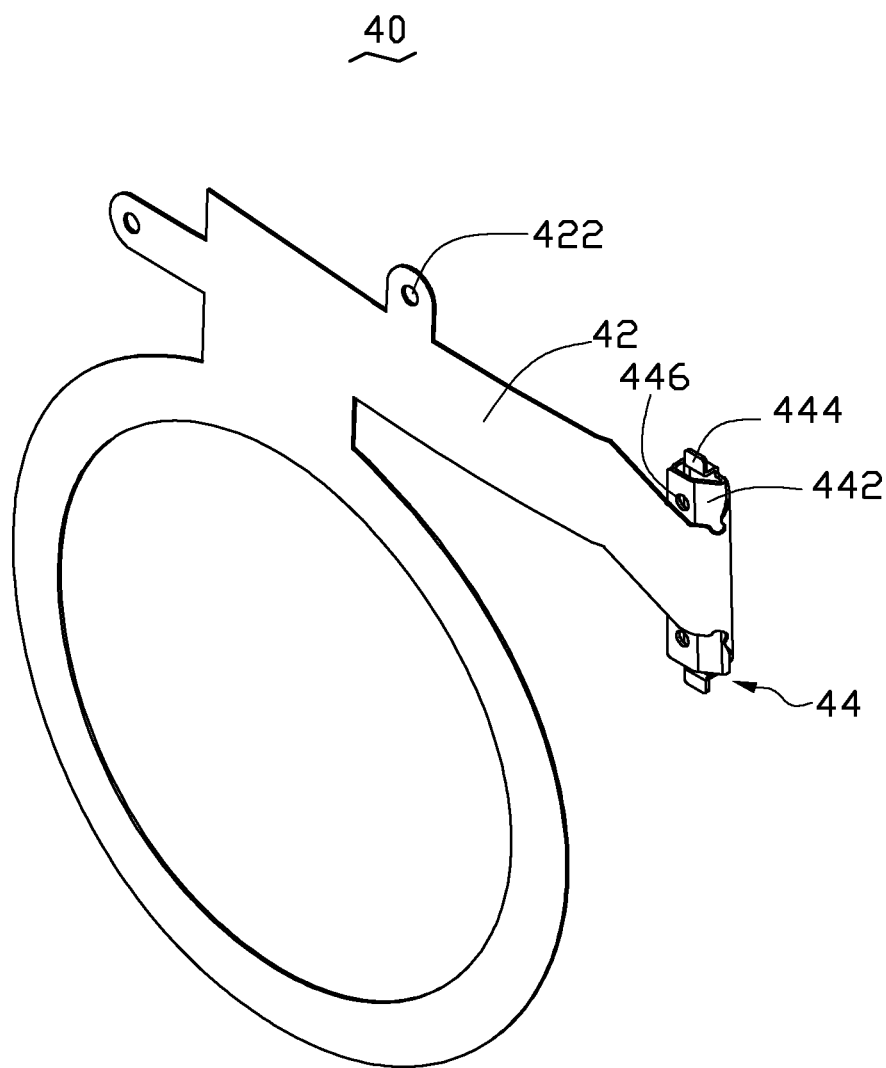
FIG. 5 is an assembled view of the flexible printed circuit module shown in FIG. 4.
Figure 8:
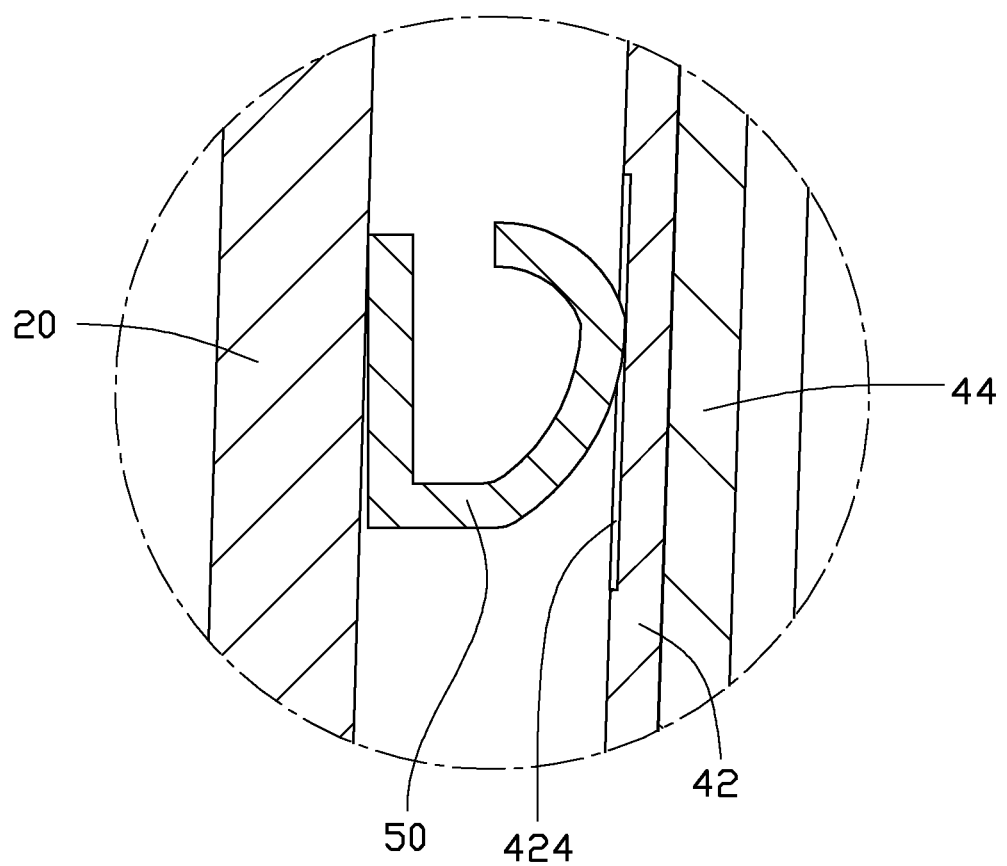
FIG. 8 is a partially enlarged view of the area VIII shown in FIG. 7.

Referring to FIGS. 4 and 5, the FPC module 40 includes a FPC board 42 and a supporting member 44. The FPC board 42 has an end portion 421 mounted to the supporting member 44. The FPC board 42 defines two positioning holes 422 for retaining the positioning pins 329 therein. The end portion 421 has a plurality of electrical terminals 424 for resisting against the elastic members 50 (FIG. 8). The electrical terminals 424 can be mounted on the end portion 421 by surface mounting technology. The supporting member 44 includes a body 442 and two latching arms 444 extending from opposite ends of the body 442. The body 442 defines two fixing holes 446 therein. The latching arms 444 are configured to be latched in the latching slot 326. The fixing holes 446 are configured for receiving the fixing pins 328 therein. The supporting member 44 is mounted on the FPC board 42 by surface mounting technology. The supporting member 44 is made of metal material, e.g., stainless steel, and it is preferred that the supporting member 44 has a layer of nickel plating thereon to enhance the bonding performance between the supporting member 44 and the FPC board 42.

Figure 6:
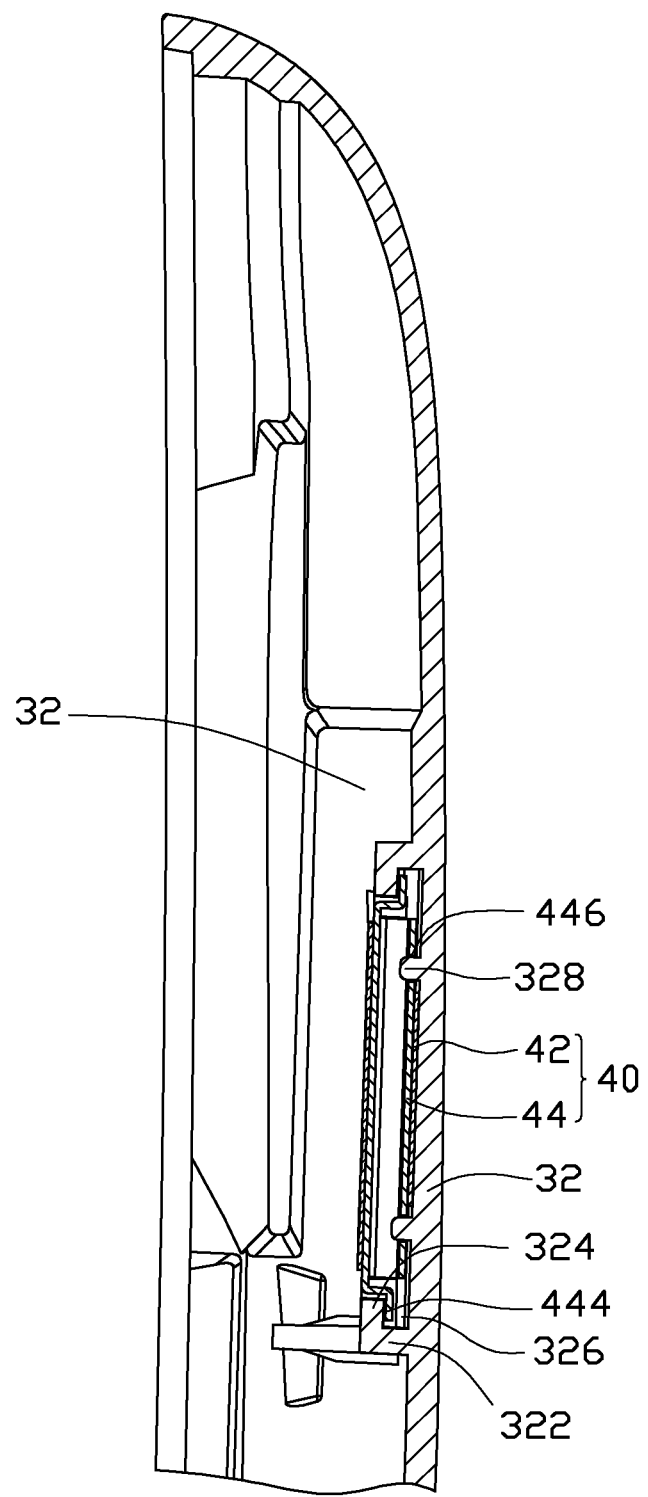
FIG. 6 is a cross-sectional view of the cover and the flexible printed circuit module shown in FIG. 2, taken along the line VI-VI.

Referring to FIGS. 5-7, in assembly, the FPC module 40 is attached to the cover 30 with the positioning pins 329 engaging in the positioning holes 422, each latching arm 444 latching into a corresponding latching slot 326, and the fixing pins 328 being locked in the fixing holes 446. Then, the cover 30 with the FPC module 40 is assembled to the housing 10, wherein the electrical terminals 424 resist against the at least one elastic members 50.

It is to be understood that the supporting member 44 enables the electrical terminals 424 of the FPC board 42 to resist against the elastic members 50. Accordingly, the elastic members 50 can securely resist against the electrical terminals 424, thus ensuring stable electrical connection of the induction coil to the main board 20. Additionally, the supporting member 44 is latched to the cover 30, thus enabling the FPC module 40 being harder to detach from the cover 30.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An FPC module, comprising:
    an FPC board having at least one electrical terminal disposed thereon; and
    a supporting member fixed on the FPC board, and supporting the portion of the FPC board having the at least one electrical terminal disposed thereon, the supporting member comprising two latching arms extended from opposite ends, the latching arms latched to a portable electronic device to secure the FPC board to the portable electronic device.

2. The FPC module as claimed in claim 1, wherein the supporting member is mounted on the FPC board by surface mounted technology.

3. The FPC module as claimed in claim 2, wherein the supporting member has a layer of nickel plating thereon.

4. The FPC module as claimed in claim 3, wherein the supporting member is made of metal material.

5. The FPC module as claimed in claim 3, wherein the supporting member is made of stainless steel.

6. A portable electronic device, comprising:
a housing comprising a main board received therein, and the main board having at least one elastic member disposed thereon;
a cover mounted on the housing; and
an FPC module, comprising: an FPC board attached on the cover, and having at least one electrical terminal disposed thereon, the at least one electrical terminal electrically contacting the at least one elastic member; and
a supporting member attached on the FPC board and latched to the cover, and supporting the portion of the FPC board having the at least one electrical terminal disposed thereon, the supporting member comprising two latching arms extended from opposite ends, the latching arms latched to the cover to secure the FPC board to the cover.

7. The portable electronic device as claimed in claim 6, wherein the supporting member is mounted on the FPC board by surface mounted technology.

8. The portable electronic device as claimed in claim 6, wherein the cover defines a latching slot therein, the latching arms are latched in the latching slot for latch the supporting member to the cover.

9. The portable electronic device as claimed in claim 8, wherein the sidewall of the cover has two opposite latching bases protruding, and two resisting arms each extending from a distal end of a corresponding latching base and facing towards each other, the latching bases, the resisting arms and the bottom wall of the cover cooperatively define a latching slot therebetween.

10. The portable electronic device as claimed in claim 8, wherein the latching slot receives at least one fixing pin projecting from the bottom wall, the supporting member defines at least one fixing hole therein, the at least one fixing pin is received in the at least one fixing hole for latch the supporting member to the cover.

11. The portable electronic device as claimed in claim 6, wherein the FPC board defines at least one positioning hole, the cover has at least one positioning pin protruding, and the at least one position pin retained in the at least one position hole for positioning the FPC board on the cover.

12. The FPC module as claimed in claim 6, wherein the supporting member has a layer of nickel plating thereon.

13. The FPC module as claimed in claim 12, wherein the supporting member is made of metal material.

14. The FPC module as claimed in claim 12, wherein the supporting member is made of stainless steel.

* * * * *